United States Patent
Jang et al.

(10) Patent No.: US 7,977,898 B2
(45) Date of Patent: Jul. 12, 2011

(54) CURRENT SENSING FOR A MULTI-PHASE DC/DC BOOST CONVERTER

(75) Inventors: Seok-Joo Jang, Irvine, CA (US); Constantin C. Stancu, Anaheim, CA (US); George R. Woody, Redondo Beach, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 480 days.

(21) Appl. No.: 12/176,842

(22) Filed: Jul. 21, 2008

(65) Prior Publication Data
US 2010/0019702 A1 Jan. 28, 2010

(51) Int. Cl.
H02P 27/06 (2006.01)
H02P 5/00 (2006.01)
G05F 1/10 (2006.01)

(52) U.S. Cl. ............ 318/139; 318/400.02; 318/400.17; 318/729; 388/805; 388/819; 323/282

(58) Field of Classification Search .............. 318/139, 318/599, 729, 811, 400.02, 400.17; 363/41, 363/132; 388/804, 805, 819; 375/238; 323/282
See application file for complete search history.

(56) References Cited

U.S. PATENT DOCUMENTS

| | | | |
|---|---|---|---|
| 6,590,794 B1* | 7/2003 | Carter | 363/98 |
| 6,801,019 B2* | 10/2004 | Haydock et al. | 322/17 |
| 7,173,393 B2* | 2/2007 | Maeda et al. | 318/400.02 |
| 7,308,192 B2* | 12/2007 | Williams et al. | 388/819 |
| 7,310,475 B2* | 12/2007 | Okuda et al. | 388/805 |
| 7,340,158 B2* | 3/2008 | Zeh et al. | 388/804 |
| 7,433,403 B2* | 10/2008 | Ishida et al. | 375/238 |
| 7,612,522 B2* | 11/2009 | Williams et al. | 318/819 |
| 7,804,266 B2* | 9/2010 | Tomigashi | 318/599 |
| 2003/0107349 A1* | 6/2003 | Haydock et al. | 322/28 |
| 2004/0131114 A1* | 7/2004 | Ishida et al. | 375/238 |
| 2004/0195995 A1* | 10/2004 | Quirion et al. | 318/811 |
| 2005/0226607 A1* | 10/2005 | Williams et al. | 388/819 |
| 2006/0067655 A1* | 3/2006 | Okuda et al. | 388/805 |
| 2008/0079377 A1* | 4/2008 | Williams et al. | 318/400.17 |
| 2008/0180056 A1* | 7/2008 | Maeda et al. | 318/729 |
| 2009/0040797 A1* | 2/2009 | Ishida et al. | 363/41 |
| 2009/0085510 A1* | 4/2009 | Pande et al. | 318/729 |
| 2010/0072980 A1* | 3/2010 | Schmitt et al. | 324/86 |

* cited by examiner

Primary Examiner — Paul Ip
(74) Attorney, Agent, or Firm — Ingrassia Fisher & Lorenz, P.C.

(57) ABSTRACT

Methods and apparatus are provided for sensing currents on a plurality of phases and determining current information therefrom. The multi-phase boost converter includes a single sensor coupled to all of the plurality of phases and a controller coupled to the sensor for determining the current information in response to currents on each of the plurality of phases sensed by the sensor. The sensing method utilizes the gate drive signals and the DC current sensor output to calculate the currents on each of the plurality of phases sensed by the sensor.

22 Claims, 7 Drawing Sheets

CURRENT SENSING FOR A MULTI-PHASE DC/DC BOOST CONVERTER

TECHNICAL FIELD

The present invention generally relates to multi-phase direct current-to-direct current (DC/DC) boost converters, and more particularly relates to a method and apparatus for current sensing for multi-phase DC/DC boost converters.

BACKGROUND OF THE INVENTION

In the existing technology, direct current-to-direct current (DC/DC) converters, such as boost converters, measure a current of a boost inductor to control the boost converter current. For conventional multi-phase DC/DC converters, a controller thereof requires current information from each phase for control of the boost converter current. The ripple current of the DC input and the output filter capacitor may be decreased by increasing the number of the phases of the DC/DC converter. Therefore, increasing the number of phases reduces the size of the output filter capacitor required. Conventionally, however, a separate current sensor is provided for each boost inductor of a phase to provide the current information for each phase to the controller. Thus, the requirement of multiple current sensors for the multiple DC/DC boost converter phases cancels out any benefit from capacitor size reduction.

Accordingly, it is desirable to provide a method and apparatus for sensing the currents of each phase which reduces the number of current sensors without reducing the number of phases. In addition, it is desirable to provide a method and apparatus for DC/DC converter current measurement and control with a reduced number of current sensors. Furthermore, other desirable features and characteristics of the present invention will become apparent from the subsequent detailed description and the appended claims, taken in conjunction with the accompanying drawings and the foregoing technical field and background.

SUMMARY OF THE INVENTION

A direct current-to-direct current (DC/DC) boost converter is provided for boosting a DC voltage provided at an input to the DC/DC boost converter. The current sensing circuit includes a singular current sensor coupled to each of a plurality of similar phases and a phase current calculating block in a boost converter controller. The plurality of similar phases boosts the DC voltage provided at the input to an output voltage, each of the plurality of similar phases having a current associated therewith and each of the plurality of similar phases including a corresponding one of a plurality of switching devices. The singular current sensor is coupled to outputs of all of the plurality of similar phases and senses a summed current of the plurality of similar phases. The boost converter controller is coupled to the plurality of switching devices for generating and providing gate drive signals thereto for sharing a current load equally between the plurality of similar phases while the input voltage is boosted up to the output voltage. The boost converter controller is also coupled to the singular current sensor for calculating current information for each of the plurality of similar phases in response to the summed current and the gate drive signals, the boost converter controller generating the gate drive signals in response to the current information calculated for each of the plurality of similar phases.

In addition, a method is provided for sensing current on a plurality of phases. The method includes the step of determining a current for each of the plurality of phases in response to a DC link current and one of a plurality of gate drive signals, wherein each of a plurality of switching transistors is associated with one of the plurality of phases and each of the plurality of gate drive signals is provided to a gate of one of the plurality of switching transistors.

An electric motor system is also provided, the electric motor system including an electric motor, an inverter, an inverter controller, a DC voltage source, a DC bus and a DC/DC boost converter. The inverter is coupled to the electric motor and provides electric control for the electric motor. The inverter controller is coupled to the inverter and generates operational control signals for controlling the inverter. The DC voltage source generates a first voltage and a first current. The DC bus provides a second voltage and a second current to the inverter for the electric control of the electric motor by the inverter. And the DC/DC boost converter is coupled to the DC voltage source and generates the second voltage and the second current in response to the first voltage and the first current, the DC/DC boost converter providing the second voltage and the second current to the DC bus. The DC/DC boost converter includes a plurality of similar phases, a singular current sensor and a boost converter controller. The plurality of similar phases boost the first voltage to the second voltage, each of the plurality of similar phases having a current associated therewith and each of the plurality of similar phases including a corresponding one of a plurality of switching devices. The singular current sensor senses the second current. And the boost converter controller is coupled to the plurality of switching devices for generating and providing gate drive signals to the plurality of switching devices for sharing a current load equally between the plurality of similar phases while controlling the summed current of the plurality of phases and boosting the first voltage to the second voltage. The boost converter controller is also coupled to the singular current sensor for calculating current information for each of the plurality of similar phases in response to the second current and the gate drive signals, wherein the boost converter controller generates the gate drive signals in response to the current information calculated for each of the plurality of similar phases.

DESCRIPTION OF THE DRAWINGS

The present invention will hereinafter be described in conjunction with the following drawing figures, wherein like numerals denote like elements.

FIG. 5, including

DESCRIPTION OF AN EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
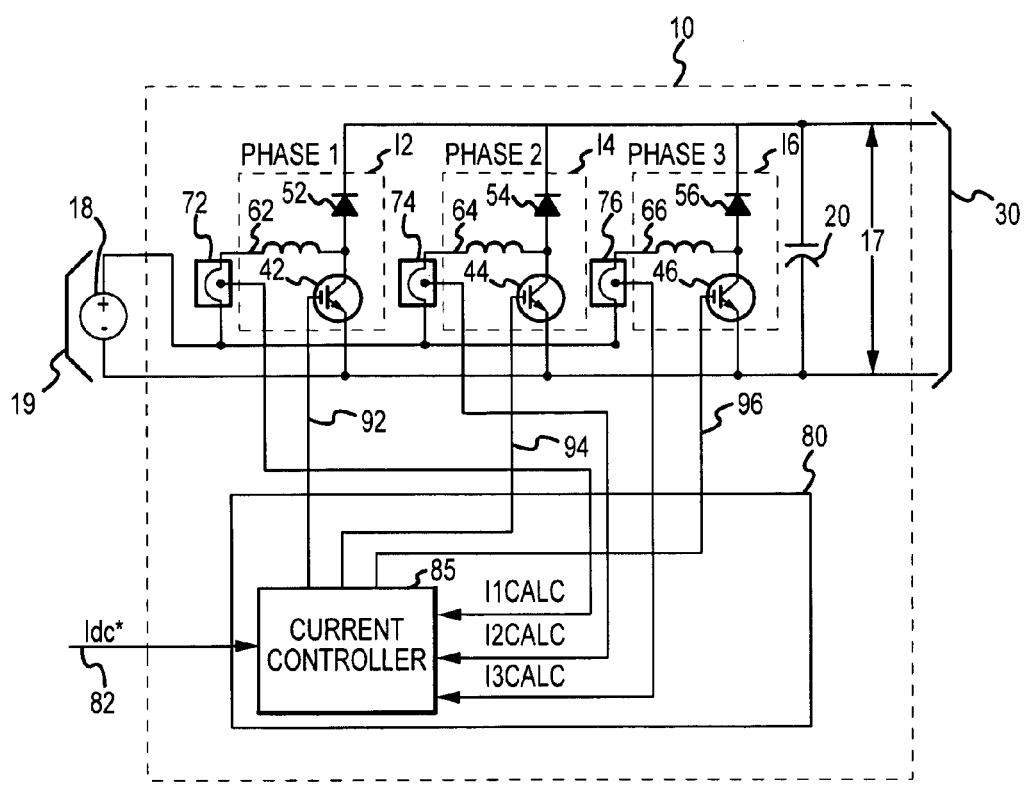
FIG. 1 illustrates a diagram of a conventional direct current-to-direct current (DC/DC) boost converter.

In the existing technology, the current of a boost inductor is measured to control a boost converter current. In multi-phase applications, a current sensor is provided for each boost inductor of each of the phases. Referring to FIG. 1, a diagram of a conventional multi-phase direct current-to-direct current (DC/DC) boost converter 10 includes three phases 12, 14, 16 to reduce the current ripple of a DC input from a DC voltage source 18, such as an electric power storage device (e.g., a battery) or an electrical power generating device (e.g., a fuel cell), and to reduce the size of an output filter capacitor 20, the output filter capacitor 20 located between the legs of the DC bus 17 at an output of the three-phase boost converter 10.

The phases 12, 14 and 16 are coupled in parallel and each phase 12, 14, 16 provides a switchable path for one leg of the DC link 19 from the input of the three-phase boost converter 10 to the output thereof. Transistors 42, 44, 46 provide the switching for each phase 12, 14, 16, the transistors 42, 44, 46 connected in series with diodes 52, 54, 56 to the output leg of the DC link 17.

The DC voltage is boosted in each of the phases 12, 14 and 16, the phases 12, 14 and 16 providing the boosted DC voltage to the output of the DC boost converter 10. In addition, inductors 62, 64 and 66 connected between the transistors 42, 44 and 46 and the diodes 52, 54 and 56, respectively, provide the DC current to respective current sensors 72, 74, 76 for measurement thereof.

The three current sensors 72, 74 and 76 provide current values I1calc, I2calc and I3calc to a boost converter controller 80 for control of the three-phase boost converter 10. A current reference Idc* provided at an input 82 to the three-phase boost converter 10 is provided to a current controller 85 of the boost converter controller 80, the current controller 85 also receiving the current values I1calc, I2calc and I3calc and controlling the switching of the phases 12, 14 and 16 by providing gate drive signals to the transistors 42, 44 and 46, the gate drive signals generated in response to the current reference Idc* and the three current values I1calc, I2calc and I3calc.

Thus, it can be seen that while the conventional multi-phase boost converter 10 can reduce the size of the output filter capacitor 20 by increasing the number of phases 12, 14, 16, each phase 12, 14, 16 requires a separate current sensor 72, 74, 76, the size of the multiple current sensors 72, 74, 76 canceling out any benefit from reducing the size of the capacitor 20.

Figure 2:
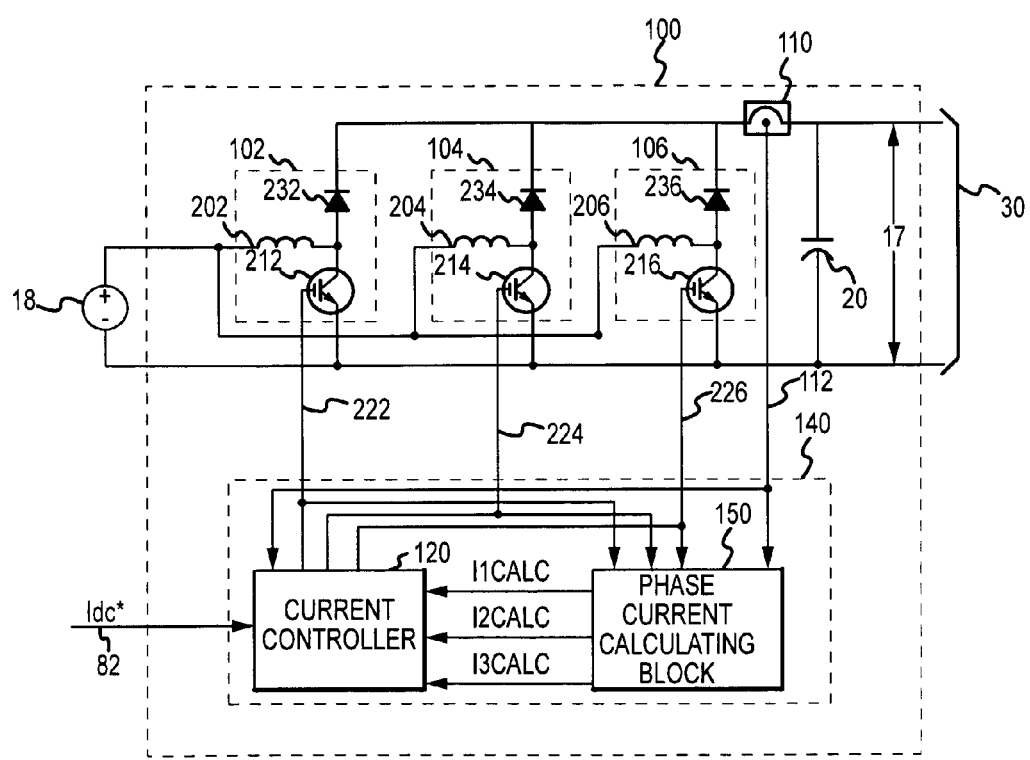
FIG. 2 illustrates a diagram of a DC/DC boost converter in accordance with an embodiment of the present invention.

A direct current-to-direct current (DC/DC) boost converter 100 in accordance with an embodiment of the present invention which overcomes the deficiencies in the prior art boost converter 10 is depicted in the diagram of FIG. 2. The DC/DC boost converter 100 is an example of a multi-phase boost converter and has three similar phases 102, 104, 106 for boosting the DC voltage. While a three-phase DC/DC boost converter 100 is described hereinbelow, those skilled in the art will realize that the principles can also be applied to a multi-phase DC/DC boost circuit having any number of phases.

A current sensing circuit includes a singular current sensor 110 and a phase current calculating block 150 in a boost converter controller 140 for sensing a summed current from the plurality of phases 102, 104, 106 and provides the sensed summed current information of all legs at the output of the DC link 17 as a summed current information signal 112 to the boost converter controller 140. The boost converter controller 140 is coupled to the current sensor 110 to provide gate drive signals for achieving the voltage boosting function and the current control function of the DC/DC boost converter 100 in accordance with the present embodiment.

In response to the summed current information signal 112 received from the current sensor 110, the boost converter controller 140 determines current information and generates gate drive signals 222, 224, 226 in response to the current information. The boost converter controller 140 provides the gate drive signals to each of the phases 102, 104, 106 for sharing a current load equally between the phases 102, 104, 106 while boosting the DC input voltage 18 in response to the gate drive signals 222, 224, 226 to provide the boosted DC voltage 30 at the output of the DC link 17.

In accordance with the present embodiment, the DC input voltage 18 is boosted at each of the phases 102, 104, 106 by boost inductors 202, 204, 206, each of the boost inductors 202, 204, 206 coupled between switching devices, transistors 212, 214, 216, and diodes 232, 234, 236. The transistors 212, 214, 216 are suitable switching devices, such as Insulated Gate Bipolar Transistors (IGBTs). The transistors 212, 214, 216 and the diodes 232, 234, 236 are coupled between the legs of the DC link 17.

The current sensor 110 senses a phase current on the first phase 102 when the transistor 212 receives a deactivating gate drive signal 222 for current to flow through the diode 232. Likewise, the current sensor 110 senses a phase current on the second phase 104 when the transistor 214 receives a deactivating gate drive signal 224 for current to flow through the diode 234, and the current sensor 110 senses a phase current on the third phase 106 when the transistor 216 receives a deactivating gate drive signal 226 for current to flow through the diode 236. The boost converter controller 140 provides activating and deactivating gate signals 222, 224, 226 to the transistors 212, 214, 216 for activation and deactivation thereof, respectively, and is coupled to the current sensor 110 to receive the sensed summed current therefrom as the summed current information signal 112.

In accordance with the present embodiment, the boost converter controller 140 includes a current controller 120 and a phase current calculating block 150. The phase current calculating block receives the gate drive signals 222, 224, 226 and the summed current information signal 112 and calculates therefrom phase current information I1calc, I2calc, I3calc for each phase 102, 104, 106. In accordance with the present embodiment, the phase current calculating block 150 calculates the phase current information I1calc, I2calc, I3calc for each of the phases 102, 104, 106 in response to current sampling of the phases 102, 104, 106 in combination with the activating and deactivating gate drive signals 222, 224, 226 generated by the current controller 120.

Figure 3:
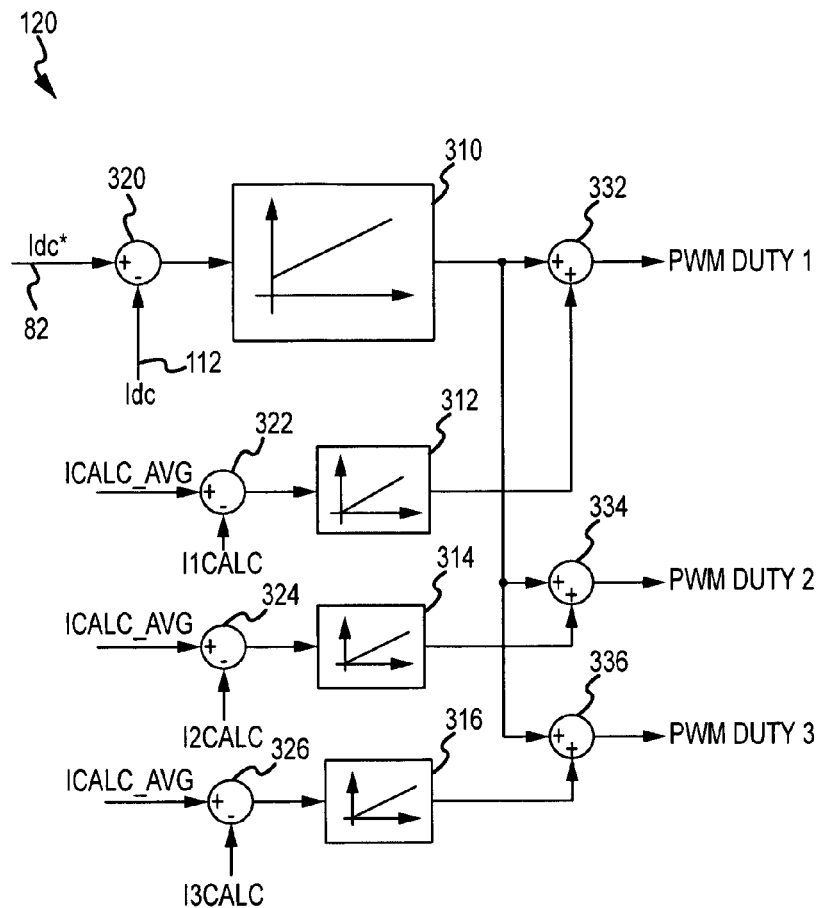
FIG. 3 illustrates a block diagram of a current controller for the DC/DC boost converter of FIG. 2 in accordance with the embodiment of the present invention.

Referring to FIG. 3, a block diagram of the current controller 120 of the boost converter controller 140 for stabilizing the phase currents in accordance with the embodiment of the present invention includes a DC current control module 310 (such as a common PI controller) and a plurality of current balance control modules 312, 314, 316 (such as steering P controllers). The reference current Idc* 82 (i.e., the set point of the DC current on the DC link 17) is combined at summer 320 with the summed current information signal Idc 112 from the DC link 17 and a difference thereof is provided to the input of the DC current control module 310. Utilizing the difference of the reference current Idc* 82 and the summed current information signal Idc 112, the DC current control module 310 compensates for errors in the DC link current during calculation of current information.

The current information includes phase current information for each of the phases 102, 104, 106 and the phase modules 312, 314, 316 calculate the phase currents from the sensed current received from the current sensing circuit 110. For example, relative current values of the phases 102, 104, 106 can be calculated and these relative current values can be used to balance the phase currents among the phases 102, 104, 106, where the relative current value is current information which may include an offset but still indicates that one phase current is higher or lower than other phase currents. In regards to the input to the phase modules 312, 314, 316, I1calc, I2calc and I3calc are average current values when gate drive signals from the current controller 120 deactivate transistors 212, 214 and 216, respectively, while Icalc_avg is the average value of I1calc, I2calc and I3calc. The relative current values I1calc, I2calc and I3calc which are calculated in the phase current calculating block 150 are determined in response to the summed current information signal 112 where is the current values I1calc, I2calc and I3calc are the sum of the currents of ones of the phases 102, 104, 106 whose corresponding transistors 212, 214, 216 are deactivated At summer 322, Icalc_avg is combined with I1calc and the difference thereof is provided to an input of the phase module 312. Likewise, at summer 324, Icalc_avg is combined with I2calc and the difference thereof is provided to an input of the phase module 314 and at summer 326, Icalc_avg is combined with I3calc and the difference thereof is provided to an input of the phase module 316. Thus, a summed current information signal Idc 112 is measured to determine the phase current differences among the phases. The phase current differences, as described hereinbelow, are used to calculate the phase current information for each of the phases 102, 104, 106 in response to multiple sensed currents by current sampling the phases 102, 104, 106.

In addition to calculating the relative current values, absolute current information can be calculated. For example, if the summed current information signal Idc 112 is 100 A when the transistors 212 and 214 are deactivated and 110 A when the transistors 214 and 216 are deactivated and 120 A when the transistors 216 and 212 are deactivated, then from the equations $$I1+I2=100 \quad (1)$$

$$I2+I3=110 \quad (2)$$

$$I3+I1=120 \quad (3)$$

The phase currents I1, I2, I3 for the phases 102, 104, 106, respectively, can be determined to be $$I1=55 A \quad (4)$$

$$I2=45 A \quad (5)$$

$$I3=65 A \quad (6)$$

Thus, currents of each of the plurality of phases 102, 104, 106 can be calculated from the single current sensor 110. To control the multi-phase DC/DC converter 100, the controller 140 needs the absolute or the relative current information of each of the plurality of phases 102, 104, 106. Where typically as many current sensors as the number of phases are required, the present embodiment provides a single current sensor 110 for current sampling the plurality of phases 102, 104, 106 in response to the gate drive signals from the current controller 120, enabling the boost converter controller 140 to calculate the current information for each of the plurality of phases 102, 104, 106 in response to the gate drive signals and the DC link current.

The current controller 120 utilizes the current information provided from the phase modules 312, 314, 316 as current balancing signals to modify the pulse width modulated (PWM) duty cycle of the gate drive signals (shown as PWM duty 1, PWM duty 2 and PWM duty 3 corresponding to the activation times of transistors 212, 214, 216, respectively). To derive the PWM duty 1 signal, the current balancing signal provided from the output of the phase module 312 is combined with the output signal from the DC current control module 310 at a summer 332, the sum thereof being the time of activation for the transistor 212 (PWM duty 1).

Likewise, the PWM duty 2 signal is derived at summer 334 as the sum of the output of the DC current control module 310 and the output of the phase module 314, and the PWM duty 3 signal is derived at summer 336 as the sum of the output of the DC current control module 310 and the output of the phase module 316.

In this manner, the controller 120 stabilizes and balances the currents of the phases 102, 104, 106 to provide regulated, stable current for boosting the voltage at each of the phases 102, 104, 106. For example, if all of the phases 102, 104, 106 are well-balanced, I1calc, I2calc and I3calc have the same value, thereby providing a zero value to the input of each of the phase modules 312, 314, 316. However, if a current value of phase 102 is lower than the current values of phases 104 and 106, the output of the phase module 312 becomes a positive value which is added to the error signal from the DC current control module 310 at summer 332 to increase the duty cycle of the transistor 212, PWM duty 1. By increasing PWM duty 1, the current value of phase 102 is increased to stabilize it to the same value for the phases 104 and 106.

Figure 4:
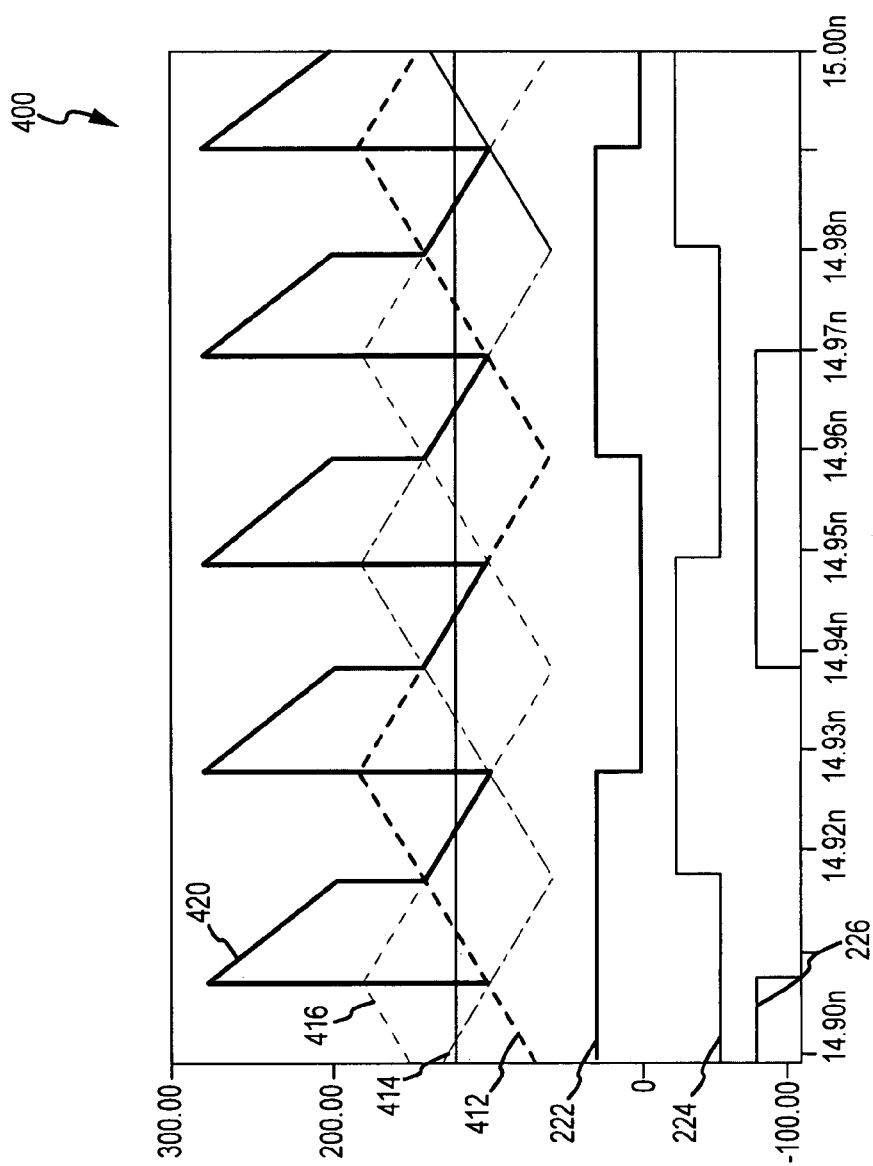
FIG. 4 illustrates a timing diagram of gate drive signals and currents for the phase current calculating block of FIG. 2 in accordance with the embodiment of the present invention.

Referring to FIG. 4, a magnified timing diagram 400 depicts gate drive signals 222, 224, 226 and current waveforms 412, 414, 416 for respective phases 102, 104, 106 in accordance with the present embodiment. When the gate drive signal 222, 224 or 226 is high, the respective transistor 212, 214 or 216 is activated (e.g., turned "ON"). The trace 420 represents the summed current information signal 112 and is the sum of the phase currents flowing through the phases 102, 104, 106 whose corresponding transistors 212, 214, 216 are deactivated (e.g., turned "OFF"). As described above, the current for each of the phases 102, 104, 106 can be determined in response to the summed current information signal 112 and the gate drive signals 222, 224, 226 when current sampling the phases 102, 104, 106.

Figure 5A:
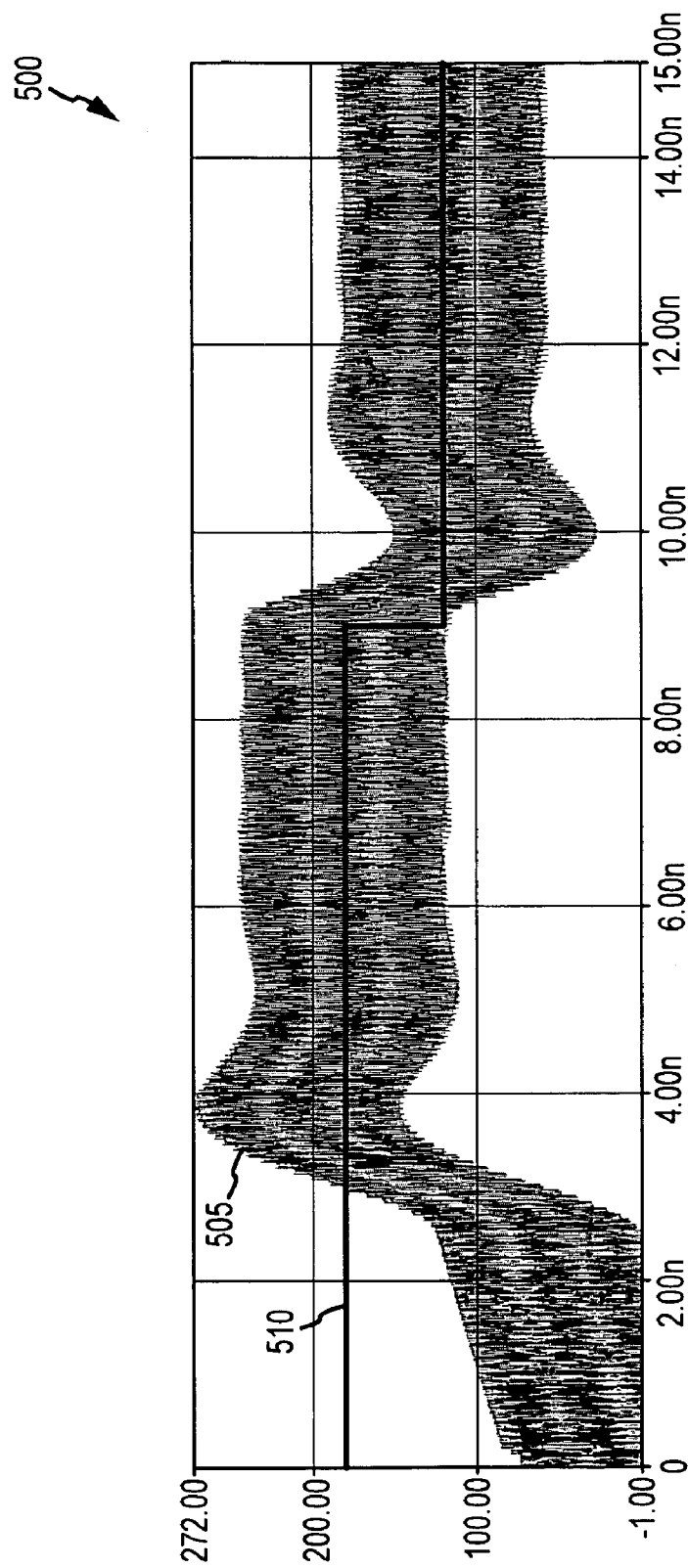
FIGS. 5A and 5B, illustrates a graph of current waveforms of a DC/DC boost converter for the prior art multi-phase current sensing circuit of FIG. 1 (FIG. 5A) and for the current sensing circuit of FIG. 2 in accordance with the embodiment of the present invention (FIG. 5B)
Figure 5B:
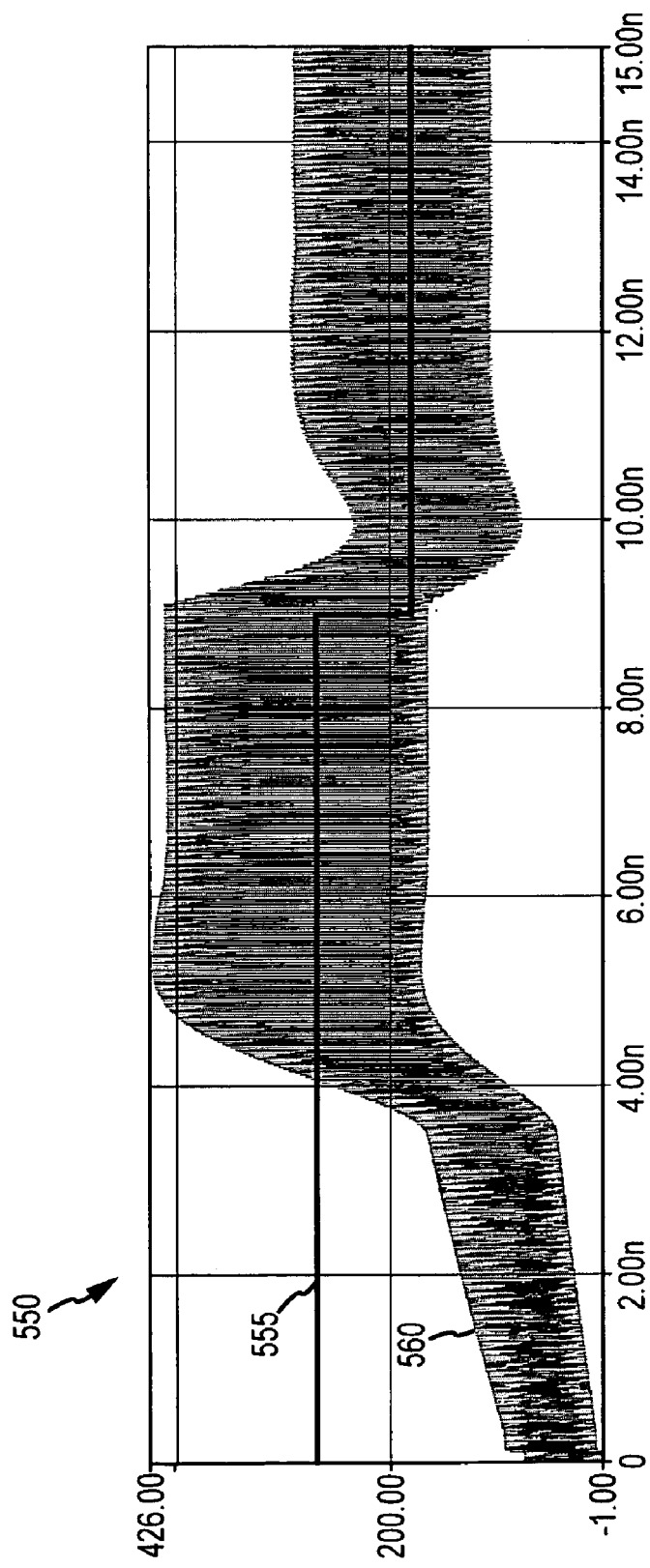

FIG. 5, including FIGS. 5A and 5B, illustrates a graph 500 (FIG. 5A) of waveforms for current sensing for the prior art multi-phase boost converter 10 (FIG. 1) and a graph 550 (FIG. 5B) of waveforms for current sensing for the multi-phase boost converter 100 in accordance with the present embodiment.

Referring to FIG. 5A, the DC/DC boost converter 10 with three current sensors 72, 74, 76 for separately detecting the currents of the three phases 12, 14, 16 for control thereof produces a DC current response signal 505 when the DC set point 510 of the current controller 85 has a step response as shown.

Referring to FIG. 5B the DC current set point 555 and the DC current response waveform 560 are depicted on the graph 550. As can be seen from a comparison of FIGS. 5A and 5B, operation of the multi-phase boost converter 100 using the single current sensor 110 feedback structure in accordance with the present embodiment produces results similar to a conventional multi-phase boost converter and can be utilized for most multi-phase boost converters.

Figure 6:
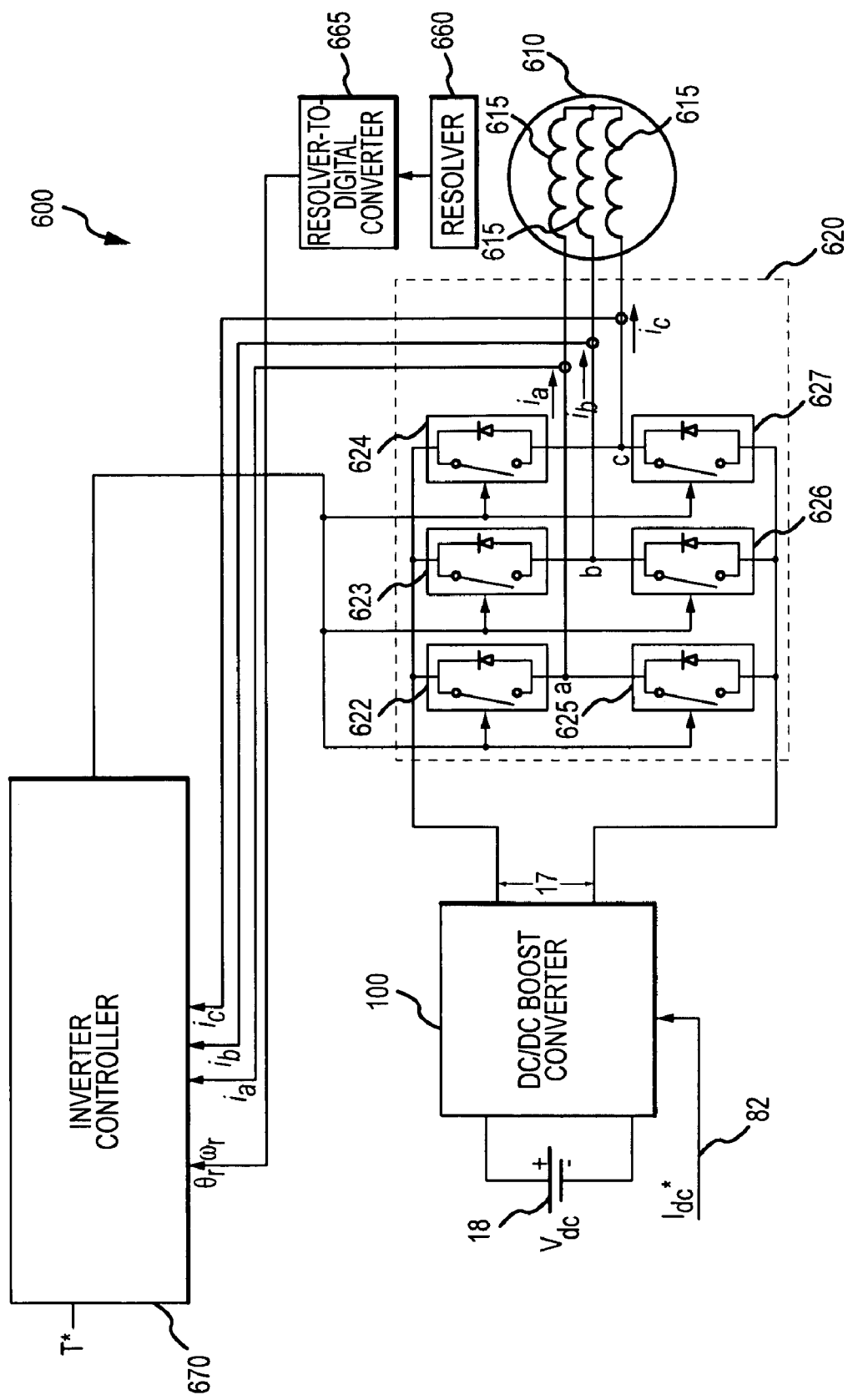
FIG. 6 illustrates a block diagram of an electric motor and its control system utilizing the DC/DC boost converter of FIG. 2 in accordance with the embodiment of the present invention.

Referring to FIG. 6, an electric motor system 600 utilizing a DC/DC boost converter 100 in accordance with the present embodiment includes a three-phase electric motor 610, such as an induction machine or a permanent magnet electric motor, which operates in response to signals from a motor control circuit 620, such as an inverter. A DC voltage source 18 generates a first voltage and a first current, providing the first voltage and first current to the DC/DC boost converter 100. The DC/DC boost converter 100 is a multi-phase DC/DC boost converter such as the three-phase DC/DC boost converter 100 depicted in FIG. 2 and generates a second voltage and a second current as described above in response to the first voltage and the first current. The second voltage is provided on the DC bus 17 to the inverter 620. The second current is the summed current of the currents of each of the similar phases 102, 104, 106 that is sensed as the DC link current on the DC bus 17 by the singular current sensor 110 (FIG. 2).

The inverter 620 includes switches 622 to 627 and operates in response to operational control signals from an inverter controller 670 to provide voltage to each phase or motor winding 615 of the motor 610, each of the switch pairs 622/625, 623/626 and 624/627 forming a phase leg of the inverter 620. In addition to the switch circuitry depicted in the inverter 620, the switches 622 to 627 could alternatively be implemented by transistors, such as Insulated Gate Bipolar Transistors (IGBTs).

A resolver 660 (or similar sensing device or virtual software equivalent) is coupled to the motor 610 for measuring the rotor position and detecting the speed thereof. A resolver-to-digital converter 665 converts the signals from the resolver 660 to digital signals and provides those digital representations of angular position and detected speed of the rotor of the motor 610 to the controller 670.

The controller 670 receives the digital representations of angular position and detected rotor speed from the resolver-to-digital converter 665 as well as current signals ($I_a$, $I_b$, $I_c$) from each phase 615 of the motor 610 and modifies the phase currents ($I_a$, $I_b$, $I_c$) in response to a torque control signal (torque command T*) to generate operational control signals for provision to the inverter 620 for control of the switches 622, 623, 624, 625, 626, 627. The torque control signal T* is received from a higher level controller, and the operational control signals produced in response thereto are high frequency pulse width modulation (PWM) signals used to control the per-cycle average, output voltage magnitude, phase, and frequency of the inverter 620. Typically, the switches 622, 623, 624, 625, 626, 627 of the inverter 620 operate at a constant switching frequency while the switch duty cycles are modulated to produce three phase voltages of desired magnitudes, phase, and frequency to provide to the motor windings 615 of the motor 610.

Use of the DC/DC boost converter 100 in accordance with the present embodiment in the electric motor system 600 reduces the current ripple of the first current from the DC voltage source 18 and enables the use of a reduced-size output filter capacitor 20 (FIG. 2). Thus it can be seen that a multi-phase DC/DC boost converter 100 in accordance with the present embodiment provides a method and apparatus for sensing the currents of each of the multi-phases while reducing the number of current sensing circuits to one. While the increased frequency of current sampling and the additional calculation time necessary for implementation of the current sensing method in accordance with the present embodiment may result in a reduced control response, the size reduction of the DC/DC boost converter 100 and the output filter capacitor 20 provides significant advantages in both product size and product cost which outweigh any such control response reduction.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for sensing current on a plurality of phases, wherein each of the plurality of phases includes a switching transistor associated with a particular one of the plurality of phases and having a gate, the method comprising the steps of:

generating, at each of the switching transistors, a phase current in response to a corresponding one of a plurality of gate drive signals being applied to one of the gates of the plurality of switching transistors;

receiving, at a current sensor, the phase currents from the plurality of phases, and generating a summed current information signal that comprises summed phase currents of the plurality of phases;

processing multiple samples of a set of the gate drive signals and the summed current information signal to calculate current information for each of the plurality of phases; and generating the gate drive signals in response to the summed current information signal and the current information calculated for each of the plurality of phases.

2. A direct current-to-direct current (DC/DC) boost converter comprising:

a plurality of similar phases for boosting a DC voltage provided at an input to the DC/DC boost converter, each of the plurality of similar phases having a current associated therewith and each of the plurality of similar phases including a corresponding one of a plurality of switching devices;

a singular current sensor coupled to outputs of the plurality of similar phases for sensing a summed current of the plurality of similar phases; and a boost converter controller coupled to the plurality of switching devices for generating and providing gate drive signals thereto for sharing a current load equally between the plurality of similar phases, the boost converter controller further coupled to the singular current sensor for calculating current information for each of the plurality of similar phases in response to the summed current and the gate drive signals, wherein the boost converter controller generates the gate drive signals in response to the current information calculated for each of the plurality of similar phases.

3. The DC/DC boost converter in accordance with claim 2 wherein the boost converter controller determines the current for each of the plurality of similar phases by current sampling the plurality of similar phases in response to the gate drive signals.

4. The DC/DC boost converter in accordance with claim 3 wherein the boost converter controller comprises:
a phase current calculator coupled to the singular current sensor and calculating the current information for each of the plurality of similar phases in response to the summed current of the plurality of similar phases and the gate drive signals; and
a current controller coupled to the phase current calculator for receiving the current of each of the plurality of similar phases calculated by the phase current calculator and generating the gate drive signals in response thereto.

5. The DC/DC boost converter in accordance with claim 4 wherein the current controller further receives the summed current of the plurality of phases as a summed current information signal generated by and provided from the singular current sensor, the current controller generating the gate drive signals in response to the summed current information signal and the current of each of the plurality of similar phases calculated by the phase current controller.

6. The DC/DC boost converter in accordance with claim 4 wherein the current controller comprises:
a DC current control module for controlling a DC current value at an output thereof, the DC current value corresponding to a sum of the current of each of the plurality of similar phases; and
a plurality of current balance control modules, each of the plurality of current balance control modules corresponding to one of the plurality of similar phases and calculating a difference of an average current of all of the plurality of similar phases and the current of a corresponding one of the plurality of similar phases for providing additional control to the output of the DC current control module to balance current among the plurality of similar phases.

7. The DC/DC boost converter in accordance with claim 6 wherein the DC current control module receives the summed current information value from the singular current sensor, the DC current module controlling the DC current value in response to the summed current information value and a reference DC current value.

8. The DC/DC boost converter in accordance with claim 2 wherein each of the plurality of switching devices comprises an Insulated Gate Bipolar Transistor (IGBT) having a gate thereof coupled to the boost controller for receiving the gate drive signals therefrom.

9. The DC/DC boost converter in accordance with claim 2 wherein the current information comprises phase current information for each of the plurality of similar phases, and wherein the boost converter controller determines the phase current for each of the plurality of phases in response to a reference DC current value and the gate drive signals generated by the boost converter controller and provided to the plurality of switching devices.

10. The DC/DC boost converter in accordance with claim 9 wherein the singular current sensor senses the summed current as a summed current information value on a DC link output from the plurality of similar phases.

11. The DC/DC boost converter in accordance with claim 10 wherein the boost controller determines the phase current information for each of the plurality of phases in response to the summed current information value sensed by the singular current sensor, the reference DC current value and the gate drive signals.

12. An electric motor system comprising:
an electric motor;
an inverter coupled to the electric motor and providing electric control therefor;
an inverter controller coupled to the inverter for generating operational control signals and providing such operational control signals to the inverter;
a direct current (DC) voltage source for generating a first voltage and a first current;
a DC bus coupled to the inverter for providing a second voltage and a second current to the inverter for the electric control of the electric motor by the inverter; and
a DC/DC boost converter coupled to the DC voltage source for generating the second voltage and second current in response to the first voltage and the first current and providing the second voltage and the second current to the DC bus, the DC/DC boost converter comprising:
a plurality of similar phases for boosting the first voltage to the second voltage, each of the plurality of similar phases having a current associated therewith and each of the plurality of similar phases including a corresponding one of a plurality of switching devices;
a singular current sensor sensing the second current; and
a boost converter controller coupled to the plurality of switching devices for generating and providing gate drive signals thereto for sharing a current load equally between the plurality of similar phases, the boost converter controller further coupled to the singular current sensor for calculating current information for each of the plurality of similar phases in response to the second current and the gate drive signals, wherein the boost converter controller generates the gate drive signals in response to the current information calculated for each of the plurality of similar phases.

13. The electric motor system in accordance with claim 12 wherein the boost converter controller comprises:
a phase current calculator coupled to the singular current sensor and calculating the current information for each of the plurality of similar phases in response to the second current and the gate drive signals; and
a current controller coupled to the phase current calculator for receiving the current of each of the plurality of similar phases calculated by the phase current calculator and generating the gate drive signals in response thereto.

14. The electric motor system in accordance with claim 13 wherein the current controller further receives a reference current, the current controller generating the gate drive signals in response to the reference current, the second current and the current of each of the plurality of similar phases calculated by the phase current controller.

15. The electric motor system in accordance with claim 13 wherein the current controller comprises:
a DC current control module for controlling a current value corresponding to a sum of the current of each of the plurality of similar phases; and
a plurality of current balance control modules, each of the plurality of current balance control modules corresponding to one of the plurality of similar phases and calculating a difference of an average current of all of the plurality of similar phases and the current of a corresponding one of the plurality of similar phases for providing additional control to the output of the DC current control module to balance current among the plurality of similar phases.

16. The electric motor system in accordance with claim 12 wherein each of the plurality of switching devices of the plurality of similar phases of the DC/DC boost converter comprises an Insulated Gate Bipolar Transistor (IGBT) having a gate thereof coupled to the boost converter controller for receiving the gate drive signals therefrom, and wherein the inverter comprises a plurality of IGBTs, each having a gate thereof coupled to the inverter controller for receiving the operational control signals therefrom.

17. The electric motor system in accordance with claim 12 wherein the electric motor comprises a permanent magnet electric motor.

18. A method for boosting a DC voltage provided at an input to a direct current-to-direct current (DC/DC) boost converter having a plurality of similar phases each having a current associated therewith and each including a corresponding one of a plurality of switching devices, the method comprising the steps of:
   sensing a summed current of the plurality of similar phases as a summed current information signal at a singular current sensor coupled to outputs of the plurality of similar phases;
   generating a gate drive signal for each of the plurality of switching devices, wherein each of the plurality of switching devices has a gate thereof that receives one of the gate drive signals;
   calculating current information for each of the plurality of similar phases in response to the summed current information signal and the gate drive signals, wherein the gate drive signals are generated in response to the summed current information signal and the current information calculated for each of the plurality of similar phases; and
   providing the gate drive signals to the plurality of switching devices to share a current load equally between the plurality of similar phases.

19. The method in accordance with claim 18, further comprising:
   determining the current information for each of the plurality of similar phases by current sampling the plurality of similar phases in response to the gate drive signals provided to the plurality of switching devices.

20. The method in accordance with claim 19, wherein the summed current information signal from the singular current sensor has summed current information value corresponding to a sum of the current of each of the plurality of similar phases, and further comprising:
   controlling a DC current value in response to the summed current information value and a reference DC current value; and
   calculating a difference of an average current of all of the plurality of similar phases and the current information of a corresponding one of the plurality of similar phases to balance current among the plurality of similar phases.

21. The method in accordance with claim 20, wherein the current information comprises phase current information for each of the plurality of similar phases, and wherein the step of determining the current information for each of the plurality of similar phases by current sampling the plurality of similar phases in response to the gate drive signals, further comprises:
   determining the phase current information for each of the plurality of phases in response to the reference DC current value and the gate drive signals provided to the plurality of switching devices.

22. The method in accordance with claim 21 wherein the singular current sensor senses the summed current as the summed current information value on a DC link output from the plurality of similar phases, and wherein the step of determining the phase current information for each of the plurality of phases, comprises:
   determining the phase current information for each of the plurality of phases in response to the summed current information value sensed by the singular current sensor, the reference DC current value and the gate drive signals provided to the plurality of switching devices.

* * * * *